United States Patent
Friese

(10) Patent No.: US 9,268,130 B2
(45) Date of Patent: Feb. 23, 2016

(54) MICROMECHANICAL COMPONENT AND METHOD FOR PRODUCING A MICROMECHANICAL COMPONENT

(71) Applicant: Christoph Friese, Pfullingen (DE)

(72) Inventor: Christoph Friese, Pfullingen (DE)

(73) Assignee: ROBERT BOSCH GMBH, Stuttgart (DE)

(*) Notice: Subject to any disclaimer, the term of this patent is extended or adjusted under 35 U.S.C. 154(b) by 384 days.

(21) Appl. No.: 13/864,530

(22) Filed: Apr. 17, 2013

(65) Prior Publication Data
US 2013/0271806 A1    Oct. 17, 2013

(30) Foreign Application Priority Data

Apr. 17, 2012 (DE) .......................... 10 2012 206 269

(51) Int. Cl.
*G02B 26/08* (2006.01)
*B81B 7/02* (2006.01)
*B81C 3/00* (2006.01)

(52) U.S. Cl.
CPC ............... *G02B 26/085* (2013.01); *B81B 7/02* (2013.01); *B81C 3/008* (2013.01); *Y10T 29/49826* (2015.01)

(58) Field of Classification Search
CPC .......................... G02B 26/085; G02B 26/0833
USPC ............. 359/221.2, 291, 200.7, 212.1, 213.1, 359/223.1, 224.1
See application file for complete search history.

(56) References Cited

U.S. PATENT DOCUMENTS

2002/0122238 A1* 9/2002 Knipe .......................... 359/291

FOREIGN PATENT DOCUMENTS

EP           0838285          4/1998

* cited by examiner

*Primary Examiner* — Euncha Cherry
(74) *Attorney, Agent, or Firm* — Kenyon & Kenyon LLP

(57) ABSTRACT

A micromechanical component is described as having a mounting support, an actuator plate having a coil, situated on and/or in the actuator plate, which is connected to the mounting support via at least one supply line spring. A mirror element and/or filter element is connected to the mounting support via the actuator plate and the at least one supply line spring. A spacer has a first end that contacts an inner side of the mirror element and/or the filter element that is directed away from an incident light surface of the mirror element and/or the filter element. The spacer has a second end that contacts a carrier side of the actuator plate that is aligned towards the mirror element and/or the filter element. Also described is a method for producing a micromechanical component.

15 Claims, 4 Drawing Sheets

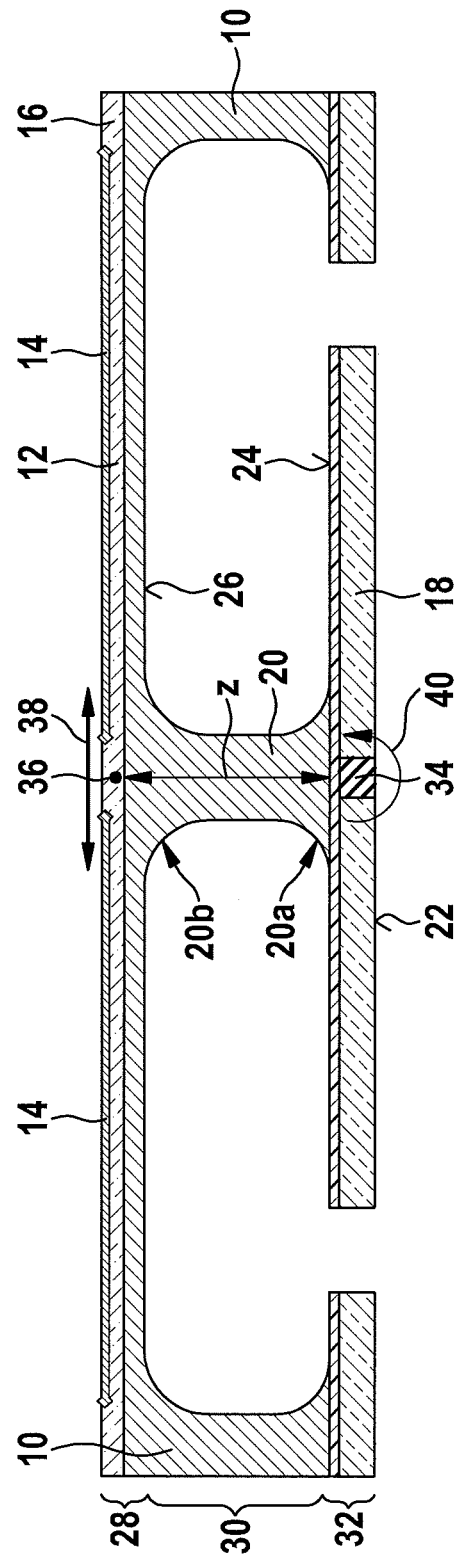

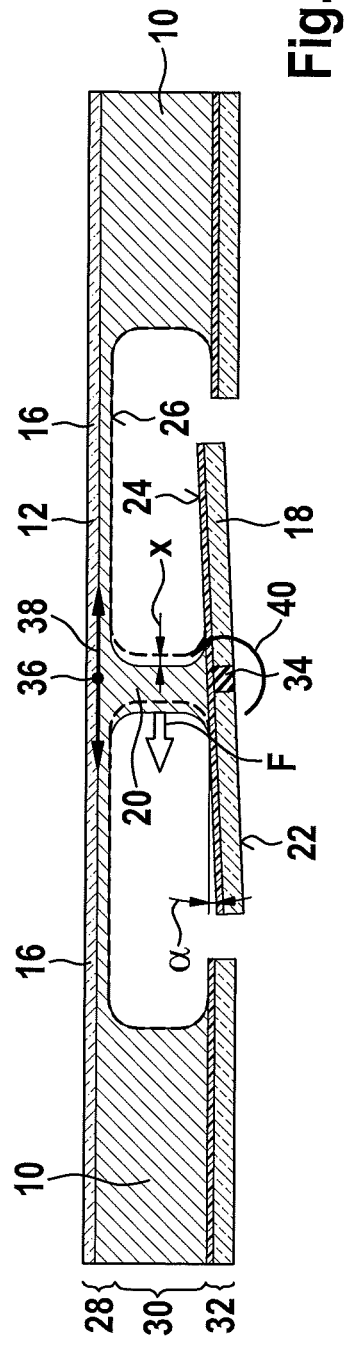
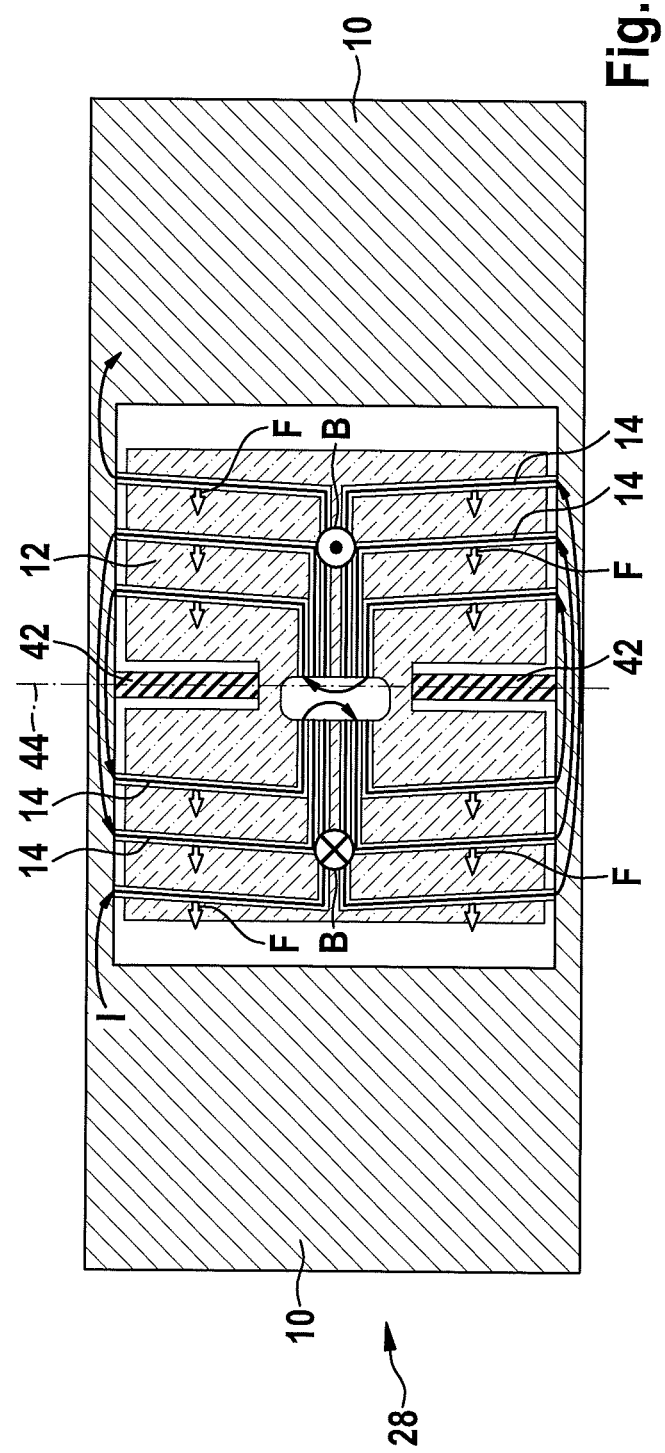
Fig. 2c
Fig. 2d

US 9,268,130 B2

MICROMECHANICAL COMPONENT AND METHOD FOR PRODUCING A MICROMECHANICAL COMPONENT

FIELD OF THE INVENTION

The present invention relates to a micromechanical component and a micromirror device. The present invention also relates to a method for producing a micromechanical component. In addition, the present invention relates to a method for producing a micromirror device.

BACKGROUND INFORMATION

European Published Patent Application No. 0 838 285 describes an electromagnetic actuator developed on a mirror device. The mirror device includes an outer actuator plate that is framed by a mounting support and an inner actuator plate that is framed by the outer actuator plate, which are each connected via two supply line springs to the skirting unit. Coils are developed on the actuator plates which are able to be supplied with current in such a way that the respective actuator plate is able to be adjusted with reference to the surrounding unit, based on a Lorenz force, about a respective rotational axis. In this way, a mirror situated on the inner actuator plate is supposed to be adjustable about two axes of rotation.

SUMMARY

The present invention implements a micromechanical component, whose mirror element and/or filter element are able to be situated in a first plane, which lies outside a second plane of the actuator plate. This may also be paraphrased to say that the coil that is usable for an electromagnetic drive and requires a relatively large attachment area is able to be accommodated below or above the mirror element and/or the filter element developed as a mirror plate or filter. In this way, the expansion of the micromechanical component parallel to an incident light surface of the mirror element and/or filter element is able to be significantly reduced. The reduction of the expansion of the micromechanical component parallel to the incident light surface of the mirror element and/or filter element simplifies its arrangement at a preferred position. In addition, the reduction of the expansion of the micromechanical component in parallel to the incident light surface is able to contribute to its cost reduction.

In addition, the present invention implements a micromechanical component having a mechanical lever for optimizing the force able to be exerted/disposable for adjusting the mirror element and/or filter element, and/or for increasing an achievable excursion of the mirror element and/or filter element with reference to the mounting support. Using the implementable lever system of the mirror system and/or filter system, the drive efficiency is able to be increased in response to adjusting the mirror element and/or filter element. Consequently, the mirror element and/or filter element is able to be adjusted using a simple and cost-effectively executable electromagnetic drive reliably and over a comparatively long adjustment path.

The carrier side of the actuator plate is aligned, for example, in parallel to the incident light surface and/or the inner side of the mirror element and/or filter element, at least while no current is supplied to the coil. This makes possible an especially space-saving arrangement of the actuator plate with the coil in the micromechanical component.

At least one line is preferably guided via at least one supply line spring in such a way that the coil is able to be supplied with current. Consequently, the supply line spring is able to be utilized for connecting the coil to an electronic system of an electromagnetic drive that is developed on or in the mounting support.

The at least one supply line spring is able to be formed exclusively of at least one conductive material, which spans at least one gap lying between the actuator plate and the mounting support in a self-supporting manner. Consequently, the at least one supply line spring is easily able to be developed having a comparatively low supply line spring constant. At the same time, the at least one supply line spring is able to be utilized as at least one line for supplying current to the coil.

As an alternative or as a supplementation to this, the at least one supply line spring may be developed to be meander-shaped and/or spiral-shaped. The supply line spring constant may also be significantly reduced by a meander-shaped and/or a spiral-shaped development of the at least one supply line spring.

In one advantageous refinement, the mirror element and/or filter element is additionally connected to the mounting support via at least one vibratory spring which spans at least one further gap lying between the mirror unit and/or filter unit and the mounting support. The at least one vibratory spring may be utilized to increase the stiffness of the overall spring system made up of the at least one supply line spring and the at least one vibratory spring, via which the mirror element and/or filter element is connected to the mounting support. In this way, a natural frequency of a desired excursion motion/adjustment motion of the mirror element and/or filter element is able to be set to a preferred value for deflecting a light beam directed upon it. In addition, using a suitable development/guidance of the at least one vibratory spring, the alignment of the preferred vibratory motion of the mirror element and/or filter element is able to be steered in the desired direction.

The at least one vibratory spring is advantageously developed as a torsional spring. As will be discussed more exactly below, there is thus able to be implement reliably an advantageous mechanical lever for optimizing an adjusting force exerted upon a mirror element and/or filter element.

The mirror element and/or filter element is preferably able to be set into an adjusting motion by supplying current to the coil and providing a magnetic field at the coil, which is counteracted by a supply line constant of the at least one supply line spring and a vibratory spring constant of the at least one vibratory spring, the supply line spring constant of the at least one supply line spring being less than the vibratory spring constant of the at least one vibratory spring. Because of the development of the at least one supply line spring having a smaller supply line spring constant than the vibratory spring constant of the at least one vibratory spring, a mechanical stress occurring in response to the excursion of the mirror element and/or filter element with respect to the mounting support is able to be reduced in the at least one supply line spring. It may thus be prevented that the at least one line guided via the at least one supply line spring is damaged/deformed during an adjusting motion of the mirror element and/or filter element. Because of the advantageous embodiment of the at least one supply line spring having a comparatively small supply line spring constant, the service life/utilization time of the at least one line for supplying current to the coil is able to be prolonged.

The at least one vibratory spring is advantageously developed as a lineless spring. By this one may understand that no line is guided via the at least one vibratory spring. Consequently, the at least one vibratory spring is able to be developed having a comparatively large vibratory spring constant, without fear of damage of a line, guided via it, based on mechanical stresses occurring in the at least one vibratory spring during the readjusting motion of the mirror element and/or filter element.

In addition, the at least one supply line spring is patterned out of a first layer having a first layer thickness, the at least one vibratory spring being patterned out of a second layer having a second layer thickness that is greater than the first layer thickness. In this way, the advantageous ratio of the supply line spring constant and the vibratory spring constant, in which the supply line spring constant is less than the vibratory spring constant, is able to be effected by a production method that is simple to carry out.

The actuator plate is, for instance, formed from the coil embedded in at least one insulating material, and is suspended in a self-supporting manner using at least two supply line springs in a recess of the mounting support. Thus, the actuator plate is able to be formed having a comparatively low weight. As an alternative to the development of the actuator plate described here, the coil embedded in the at least one insulating material may also be applied onto a semiconductor layer, such as a silicon layer.

The advantages mentioned above may also be assured using a micromirror device having an appropriate micromechanical component.

In one advantageous refinement, the micromirror device additionally includes a further mirror element that is able to be adjusted about a first rotational axis, by which a light beam is able to be deflected onto the incident light surface of the mirror element and/or the filter element, which is developed as a mirror, and is readjustable using the supplying with current of the coil about a second axis of rotation that is aligned at an inclination to the first axis of rotation. Using the present invention, one may thus implement a mirror device by which the light beam is able to be deflected about one axis of rotation, respectively, by using two mirrors. Even though the light beam deflected by the additional mirror element is not incident in a stationary manner on the mirror element and/or filter element developed as a mirror, and therefore a comparatively large incident light surface of the mirror element and/or filter element is an advantage, because of the mounting of the coil below or above the mirror element and/or filter element, a surface reduction of the micromirror device may be implemented compared to the usual device having two adjustable mirrors. Besides that, a mechanical lever may be used to readjust the mirror element and/or filter element, whereby the mirror element and/or filter element is still reliably adjustable in spite of its comparatively large incident light surface, using a cost-effective drive.

The abovementioned advantages are also able to be effected by a corresponding production method for a micromechanical component.

Furthermore, the advantages may also be ensured by an appropriate production method for a micromirror device.

BRIEF DESCRIPTION OF THE DRAWINGS

FIG. 1 shows a schematic cross section of a first specific embodiment of the micromechanical component.

FIGS. 2a-2d show schematic cross sections of a second specific embodiment of the micromechanical component.

DETAILED DESCRIPTION

Figure 2A:
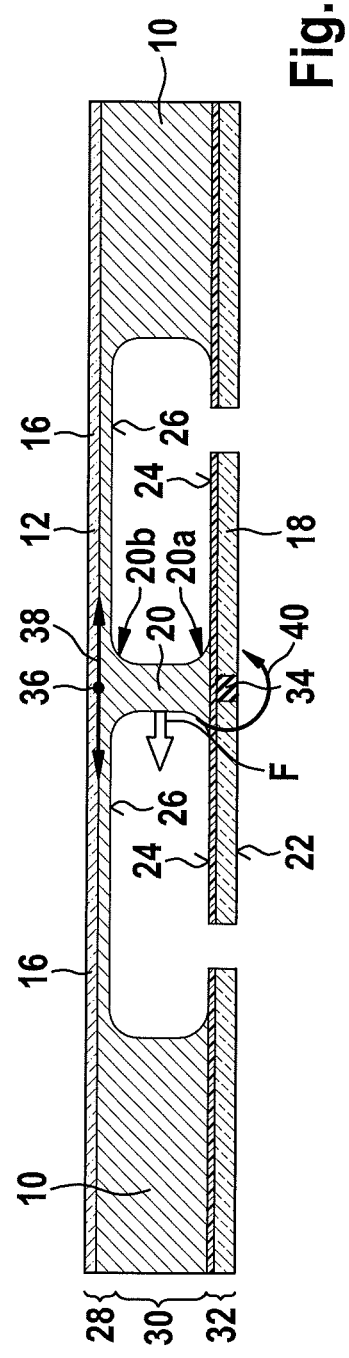

FIG. 1 shows a schematic cross section of a first specific embodiment patterned out of component.

The micromechanical component shown schematically in FIG. 1 has a mounting support 10. Mounting support 10 is connected to an actuator plate 12 via at least one supply line spring (not sketched in FIG. 1). On and/or in actuator plate 12, a coil 14 is situated (that is only schematically reproduced). Coil 14 may be composed of a plurality of line sections, made of a metal and/or a doped semiconductor material, which is embedded in an insulating material 16. Coil 14 is preferably made of copper. The ability to be developed, of coil 14, that is not shown here in greater detail, is not limited to the use of copper. Coil 14 may be embedded in an oxide, for example, as the at least one insulating material. In this way, the mechanical stability of coil 14 is able to be improved. The insulating material is also able to protect coil 14 from environmental influences.

The micromechanical component reproduced here is not limited to any particular development of coil 14, to a certain conductive material of coil 14 and/or to a certain insulating material 16. For this reason, we shall not go further into the construction and the material composition of actuator plate 12 at this point.

The micromechanical component also has a mirror element and/or filter element 18, which is connected via actuator plate 12 and the at least one supply line spring to mounting support 10. Between actuator plate 12 and mirror element and/or filter element 18 a spacer 20 is situated which, at a first end 20a of spacer 20 contacts the inner side 24 of mirror element and/or filter element 18 that faces away from incident light surface 22 of mirror element and/or filter element 18. By incident light surface 22 of mirror element and/or filter element 18 one may also understand a mirror side, a mirror surface, an incident light side and/or an optically active area. Inner side 24 of mirror element and/or filter element 18 is preferably aligned counter to incident light surface 22. One may also paraphrase this to say that inner side 24 faces actuator plate 12, while incident light surface 22 is directed away from actuator plate 12. Inner side 24 of mirror element and/or filter element 18 may optionally be covered by an insulating material.

At the second end 20b of spacer 20, the latter contacts a carrier side 26 of actuator plate 12 that faces mirror element and/or filter element 18. Spacer 20 is preferably inclined, particularly at right angles, to a longitudinal direction/maximum extension of actuator plate 12. Spacer 20 may be aligned, particularly in an inclined manner, more preferred at right angles, to incident light surface 22, inner side 24 and/or carrier side 26.

The construction of the micromechanical component that is schematically reproduced in FIG. 1 may also be paraphrased as an implementation of an electromagnetic drive in three planes 28 to 32. A drive plane 28 includes coil 14 that is functioning as drive unit and the at least one supply line spring. At least one line is preferably guided via at least one supply line spring in such a way that coil 14 is able to be supplied with current. We shall go into an advantageous specific embodiment possibility of the at least one supply line spring in greater detail below.

Adjacent to drive plane 28, an intermediate plane 30 is developed, having spacer 20. Spacer 20 may have a height z, which is not limited to a certain value. As will be stated more accurately below, by a suitable establishment of the height z, an advantageous mechanical lever may be implemented for readjusting mirror element and/or filter element 18.

On a side of intermediate plane 30 facing away from drive plane 28, there is an optically active plane 32 having mirror element and/or filter element 18. Using mirror element and/or filter element 18 and coil 14 in the two different planes 28 and 32, the extension of the micromechanical component in a spatial direction parallel to incident light surface 22 is able to be reduced. While usually a micromirror having a magnetically adjustable mirror plate has an additional installation space requirement for mounting the coil device that at least partially frames the mirror plate, in the specific embodiment shown here, coil 14 is able to be positioned below/above mirror element and/or filter element 18. Because of the reduction that is able to be implemented, in this manner, of the extension of the micromechanical component along the incident light surface, its arrangement at a preferred mounting position is simplified. Besides that, using the reduction of the micromechanical component in the spatial directions directed in parallel to the incident light surface, production costs may be saved.

The specific embodiment shown in FIG. 1 has an electromagnetic drive, mirror element and/or filter element 18 being able to be set into an adjusting motion by supplying coil 14 with current and by providing a magnetic field (not reproduced) at coil 14. In a preferred manner, mirror element and/or filter element 18 is additionally connected to mounting support 10 via at least one vibratory spring 34, which spans at least one gap lying between mirror unit and/or filter unit 18 and mounting support 10. Because of the additional connection of mirror element and/or filter element 18 to mounting support 10 using the at least one vibratory spring 34, the stiffness of the overall spring system, made up of the at least one line spring and the at least one vibratory spring 34 is able to be increased. In this way, a natural frequency of a preferred vibrational motion of the mirror element and/or filter element is able to be set to a preferred value. In addition, using the at least one vibratory spring 34, an adjusting motion of mirror element and/or filter element 18 may be specified that is partially decoupled from a drive motion of actuator plate 12 when coil 14 is supplied with current.

In one advantageous specific embodiment, supplying current to coil 14 and providing the magnetic field have the effect of a Lorenz force, using which a center of mass and/or a center point 36 is displaced along a first spatial direction 38 with respect to mounting support 10. The lateral displacement of center of mass 36 may be aligned, for example, in parallel to carrier side 26 and/or a maximum extension of actuator plate 12. Spacer 20 is preferably aligned perpendicular to first spatial direction 38.

The at least one vibratory spring 34 may be developed as a torsional spring, for example. (The at least one vibratory spring 34 is not limited, however, to a design as a torsional spring). Using the design of vibratory spring 34 as a torsional spring, the readjusting motion of the mirror element and/or filter element 18 may be reliably established to be a rotational motion about an axis of rotation that is preferably aligned along at least one vibratory spring 34. In this case, the readjusting of center of mass 36 along first spatial direction 38 has the effect of a rotational motion 40 of mirror element and/or filter element 18 of incident light surface 22 about an axis of rotation established by the at least one vibratory spring 34, whereas carrier side 26 of actuator plate 12, in the case of not supplying current to coil 14, is aligned parallel to incident light surface 22 and/or inner side 24 of mirror element and/or filter element 18. A rotational angle α, not sketched in FIG. 1, of excursioned incident light surface 22 with respect to the initial position of incident light surface 22, may be calculated according to equation (eq. 1):

$$\alpha = \arctan(x/z), \quad \text{(eq. 1)}$$

where x is a lateral displacement of center of mass 36 from its initial position. (The height z may particularly be the distance between center of mass 36 and the axis of rotation. One could also give rotational angle α by using a transformation of the equation (eq. 1) to equation (eq. 2):

$$x = z^* \tan \alpha \quad \text{(eq. 1)},$$

Thus, for a desired angle α of 10° and a height z of 50 µm, a lateral displacement x of less than 9 µm is sufficient. This low lateral displacement x requires only a slight deformation of the at least one supply line spring. Consequently, the mechanical stress of the at least one line, which is preferably guided via at least one supply line spring, is also small. The danger of breakup of the at least one line in response to the readjusting of mirror element and/or filter element 18 is thus negligible.

Besides, readjustment path/rotational motion 40 of mirror element and/or filter element 18 may counteract the supply line spring constant of the at least one supply line spring and the vibratory spring constant of the at least one vibratory spring 34, the supply line spring constant of the at least one supply line spring being less than the vibratory spring constant of the at least one vibratory spring 34. The at least one supply line spring constant may be less than one-half the vibratory spring constant, for example. The supply line spring constant may particularly be less than one-fifth of the vibratory spring constant. It is ensured by the comparatively small supply line spring constant that the readjusting of mirror element and/or filter element 18 triggers hardly any mechanical stress in the at least one supply line spring. Based on the advantageous guidance of the at least one line via the at least one supply line spring having at least a comparatively small supply line spring constant, only comparatively low mechanical stresses are exerted upon the at least one line. Consequently, the breakup of the at least one line is thus not to be feared even when there is frequent operation of the micromechanical component. And so, for the development of at least one line, materials may be used that have good conductivity, even if these have only a low rigidity. The energy consumption in the operation of the micromechanical component may be reduced by this optimization of the lines.

The advantageous ratio, quoted above, of the supply line spring constant and the vibratory spring constant is implemented, for instance, provided the at least one supply line spring is formed exclusively of at least one conductive material, which spans at least one additional gap lying between actuator plate 12 and mounting support 10 in a self-supporting manner. One may also rewrite this to say that the at least one supply line spring is developed as a line/conductor trace. The advantageous ratio of the spring constants is also ensured if the at least one supply line spring is patterned out of a first layer having a first layer thickness, the at least one vibratory spring 34 being patterned out of a second layer having a second layer thickness that is greater than the first layer thickness. As an alternative or a supplementation, the at least one supply line spring may be developed to be meander-shaped and/or spiral-shaped. Using a meander-shaped and/or a spiral-shaped development of the at least one supply line spring, the supply line spring constant may be reduced advantageously. In particular, using a meander-shaped and/or spiral-shaped development of the at least one supply line spring, the supply line spring constant is also able to be reduced if the at least one supply line spring is patterned out having a comparatively large layer thickness.

FIGS. 2a to 2d show a schematic cross section of a second specific embodiment of the micromechanical component.

The micromechanical component shown schematically in FIGS. 2a to 2d has the components already described above. In addition, in the cross sections through drive plane 28 of FIGS. 2b and 2d, supply line springs 42 are also shown. In the specific embodiments of FIGS. 2b and 2d, supply line springs 42 are drawn into actuator plate 12. Alternatively, supply line springs 42 are also able to contact actuator plate 12 on an outer edge.

In the specific embodiment reproduced here, coil 14 includes twelve coil lines, which run from the outer edge of actuator plate 12 to the middle of actuator plate 12. In each case, four coil lines running from the outer edge to the middle of actuator plate 12 are interconnected to form a coil ring. The number of supply lines and/or of coil rings of the micromechanical component may, however, be selected optionally. In this way, an available Lorenz force F for the readjusting of actuator plate 12 or mirror element and/or filter element 18 is able to be varied, particularly able to be increased. (The construction of coil 14 is reproduced only schematically in FIGS. 2b and 2d).

Figure 2B:
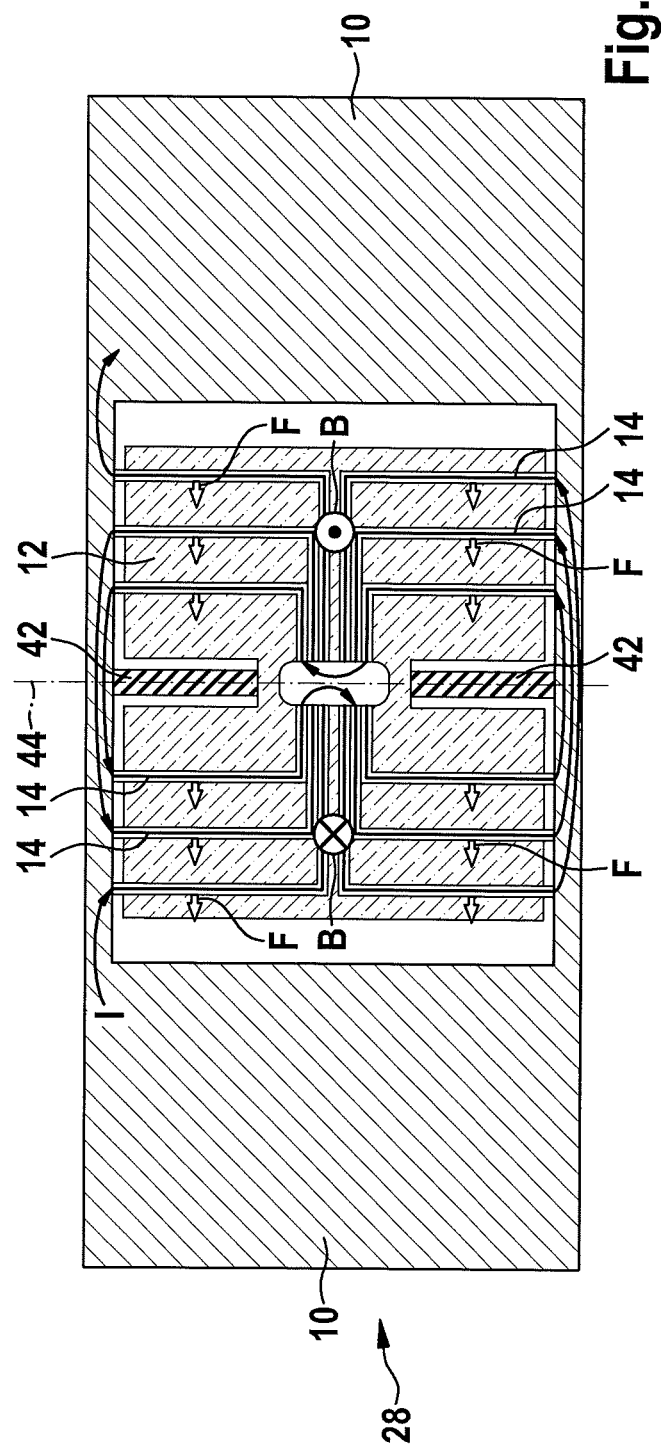

The coil lines preferably run partially parallel and partially perpendicular to the axis of rotation 44, established using the at least one vibratory spring 34, of mirror element and/or filter element 18, and projected into FIGS. 2b and 2d. A current flow through coil lines running parallel to axis of rotation 44 and magnetic field B, whose field lines are aligned inclined, preferably perpendicular to actuator plate 12 and/or to carrier side 28, effect a Lorenz force F perpendicular to axis of rotation 44. On the other hand, the coil lines aligned perpendicular to axis of rotation 44 effect force components which are mutually compensating.

FIGS. 2c and 2d show the micromechanical component during the supplying of current to coil 14. Because of the provision/application of a magnetic field B, whose field lines are inclined on the first side of axis of rotation 44 in a first direction, preferably perpendicular to actuator plate 12 and/or carrier side 26, and which run on a second side of axis of rotation 44, that is opposite to the first side, in a second direction running counter to the first direction, it may be ensured that the individual force components of the coil lines running parallel to axis of rotation 44 add up to an advantageously large Lorenz force F. Thus, actuator plate 12, or rather its center of mass 36/center point may be displaced reliably by a lateral displacement x, in first spatial direction 38, with respect to mounting support 10. Spacer 20 may also correspondingly be shifted by a lateral displacement x, in the first spatial direction 38, with respect to mounting support 10. In this way, mirror element and/or filter element 18 are able to be adjusted by an angle of rotation a that was defined above.

Figure 3:
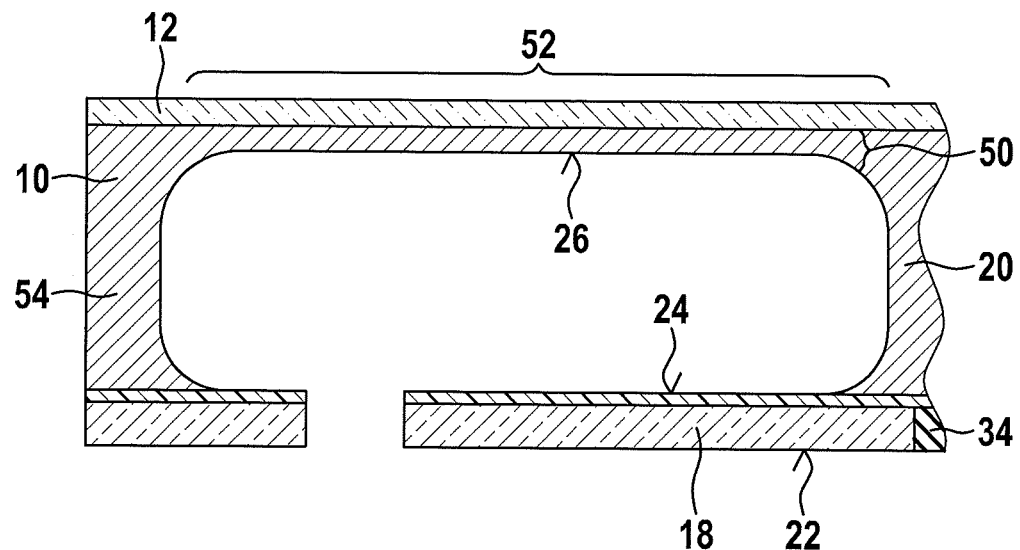
FIG. 3 shows a schematic cross section of a third specific embodiment of the micromechanical component.

FIG. 3 shows a schematic cross section of a third specific embodiment of the micromechanical component.

The specific embodiment reproduced schematically in FIG. 3 has a layer 52 applied onto a carrier layer 50, which includes coil lines (not sketched), which are embedded in insulating material 16. Layer 50, together with spacer 20 and a frame part 54 of mounting support 10, may be etched out of a semiconductor layer. This may be done, for example, by isotropic underetching of mirror element and/or filter element 18 that is developed as a mirror plate. The isotropic etching step carried out for this purpose may be stopped so early that residual regions of the semiconductor layer, at a distance from the mirror plate, still remain behind as carrier layer 50. In this way, the mechanical stability of actuator plate 12 may be increased.

Figure 4:
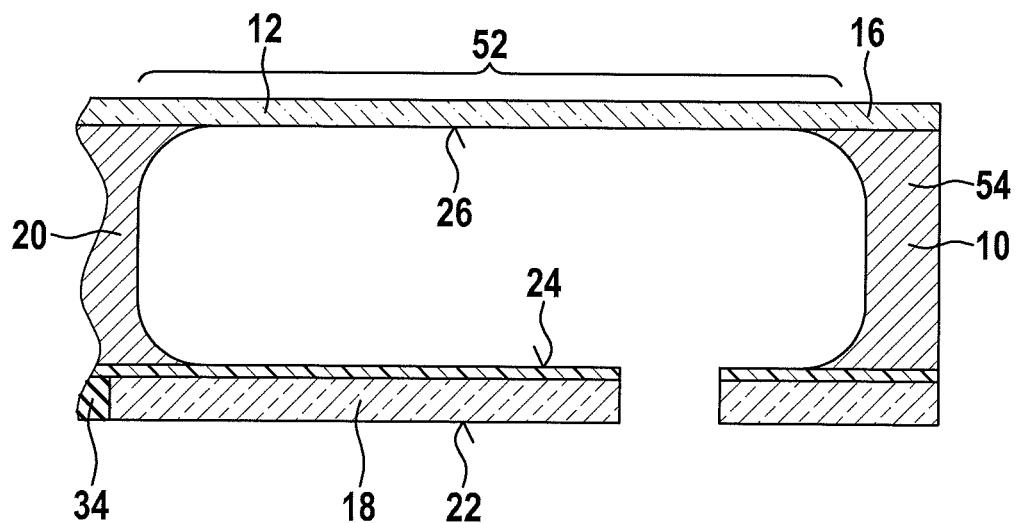
FIG. 4 shows a schematic cross section of a fourth specific embodiment of the micromechanical component.

FIG. 4 shows a schematic cross section of a fourth specific embodiment of the micromechanical component.

In the specific embodiment reproduced schematically in FIG. 4, actuator plate 12 is formed (exclusively) of coil 14 (not sketched) embedded in at least insulating material 16. Actuator plate 12 is suspended in a self-supporting manner, using at least two supply line springs, in a recess of mounting support 10. This is able to be implemented by carrying out an isotropic etching step for patterning out frame part 54 and spacer 20 of a common semiconductor layer until the semiconductor material contacting layer 52, such as silicon, has been completely removed. Actuator plate 12, having a comparatively small mass, may be readjusted in this case using a comparatively small force.

The specific embodiments described above of the micromechanical component may be used in a micromirror device. Such a micromirror device may advantageously be used for the optical deflection of a light beam, for instance, as a projector and/or scanner.

In one advantageous specific embodiment of the micromirror device, it additionally includes a further mirror element that is able to be adjusted about a first rotational axis, by which a light beam, especially a laser beam, is able to be deflected onto incident light surface 22 of mirror element and/or filter element 18, the mirror element and/or filter element 18 being developed as a mirror, and is adjustable using the supplying with current of coil 14 about a second axis of rotation that is aligned at an inclination to the first axis of rotation. The second axis of rotation may particularly be aligned perpendicular to the first axis of rotation. Consequently, the micromirror device may advantageously be used in a picture projector and/or in a 2-D scanner. Such a micromirror device may particularly be used advantageously in a head-up display of a motor vehicle.

Although the light beam deflected by the mirror element that is adjustable about the first axis of rotation is not incident in a stationary manner on incident light surface 22, and therefore a comparatively large extension of incident light surface 22 is of advantage, a volume occupied by mirror element and/or filter element 18 and coil 14, in a direction aligned in parallel to incident light surface 22, may be relatively small. This is able to be effected by using the advantageous accommodation of coil 14 outside of optical plane 32 together with mirror element and/or filter element 18. In addition, using the mechanical lever implemented by spacer 20, a comparatively large torque may be exerted for adjusting incident light surface 22 to mirror element and/or filter element 18. Consequently, the light beam deflected onto incident light surface 22 is able to be deflected reliably by an angle α about the second axis of rotation, in spite of the comparatively large extension of incident light surface 22.

The micromechanical components explained above are able to be produced via a production method in which an actuator plate having a coil situated on or in the actuator plate is connected to a mounting support via at least one supply line spring. Thereby a mirror element and/or filter element is connected to the mounting support via the actuator plate and the at least one supply line spring. In addition, the mirror element and/or filter element is connected to the actuator plate via a spacer, which at a first end of the spacer contacts the inner side of the mirror element and/or filter element directed away from an incident light surface of the mirror element and/or filter element, and at a second end of the spacer, contacts a carrier side of the actuator plate that is aligned towards the mirror element and/or filter element. The connecting of the mirror element and/or filter element to the actuator plate via the spacer may take place, for example, by an isotropic underetching of a semiconductor layer on which the mirror unit and/or filter unit has been applied at least as a part of an etching mask.

In a preferred manner, the mirror element and/or the filter element is additionally connected to the mounting support via at least one vibratory spring, which spans at least one gap lying between the mirror element and/or the filter element and the mounting support. The at least one vibratory spring is preferably developed as a lineless spring, while at least one line is guided via the at least one supply line spring for supplying current to the coil.

In one advantageous refinement, the production method may also be used to form a micromirror device, the micromechanical component produced using the method steps described above being developed, adjustable about a first axis of rotation, to have a mirror element and/or filter element as mirror and using the supplying of current to the coil. In addition, a mirror element may be developed that is adjustable about a second axis of rotation that is aligned inclined to the first axis of rotation, using which a light beam is deflected onto the incident light surface of the mirror element and/or filter element during operation of the micromirror device. Consequently, the production method described is particularly suitable for producing a projector or a scanner.

It is hereby pointed out that the executability of the production method described here is not limited to the formation of the specific embodiments, described above, of the micromechanical component. The specific embodiments of the micromechanical component described above may also be produced using a different production method.

What is claimed is:

1. A micromechanical component, comprising:
   a mounting support;
   at least one supply line spring;
   an actuator plate including a coil situated at least one of on and in the actuator plate, the actuator plate being connected to the mounting support via the at least one supply line spring;
   at least one of a mirror element and a filter element connected to the mounting support via the actuator plate and the at least one supply line spring; and
   a spacer including:
      a first end contacting an inner side of the at least one of the mirror element and the filter element facing away from an incident light surface of the at least one of the mirror element and the filter element, and
      a second end contacting a carrier side of the actuator plate aligned towards the at least one of the mirror element and the filter element.

2. The micromechanical component as recited in claim 1, wherein:
   the carrier side of the actuator plate is aligned in parallel to at least one of the incident light surface and the inner side of the at least one of the mirror element and the filter element, at least while no current is supplied to the coil.

3. The micromechanical component as recited in claim 1, further comprising:
   at least one line guided via the at least one supply line spring in such a way that the coil is able to be supplied with a current.

4. The micromechanical component as recited in claim 1, wherein the at least one supply line spring is formed exclusively of at least one conductive material that spans at least one gap, lying between the actuator plate and the mounting support, in a self-supporting manner.

5. The micromechanical component as recited in claim 1, wherein the at least one supply line spring is developed to be at least one of meander-shaped and spiral-shaped.

6. The micromechanical component as recited in claim 4, further comprising:
   at least one vibratory spring, wherein the at least one of the mirror element and the filter element is additionally connected to the mounting support via the at least one vibratory spring, the at least one vibratory spring spanning at least one additional gap lying between the at least one of the mirror element and the filter element and the mounting support.

7. The micromechanical component as recited in claim 6, wherein the at least one vibratory spring includes a torsion spring.

8. The micromechanical component as recited in claim 6, wherein:
   the at least one of the mirror element and the filter element is able to be set into an adjusting motion by supplying current to the coil and providing a magnetic field at the coil,
   the magnetic field is counteracted by a supply line spring constant of the at least one supply line spring and a vibratory spring constant of the at least one vibratory spring, and
   the supply line spring constant of the at least one supply line spring is less than the vibratory spring constant of the at least one vibratory spring.

9. The micromechanical component as recited in claim 6, wherein:
   the at least one supply line spring is patterned out of a first layer having a first layer thickness, and
   the at least one vibratory spring is patterned out of a second layer having a second layer thickness that is greater than the first layer thickness.

10. The micromechanical component as recited in claim 1, wherein:
    the actuator plate is formed from the coil embedded in at least one insulating material, and
    the actuator plate is suspended in a self-supporting manner using at least two supply line springs in a recess of the mounting support.

11. A micromirror device, comprising:
    a micromechanical component that includes:
       a mounting support;
       at least one supply line spring;
       an actuator plate including a coil situated at least one of on and in the actuator plate, the actuator plate being connected to the mounting support via the at least one supply line spring;
       at least one of a mirror element and a filter element connected to the mounting support via the actuator plate and the at least one supply line spring; and
       a spacer including:
          a first end contacting an inner side of the at least one of the mirror element and the filter element facing away from an incident light surface of the at least one of the mirror element and the filter element, and
          a second end contacting a carrier side of the actuator plate aligned towards the at least one of the mirror element and the filter element.

12. The micromirror device as recited in claim 11, further comprising:
    a further mirror element that is able to be adjusted about a first axis of rotation, and by which a light beam is able to be deflected onto the incident light surface of the at least one of the mirror element and the filter element, wherein:
       the at least one of the mirror element and the filter element is developed as a mirror, and
       the further mirror is adjustable, using a supplying with a current of the coil, about a second axis of rotation that is aligned at an inclination to the first axis of rotation.

13. A method for producing a micromechanical component, comprising:
- connecting an actuator plate including a coil situated at least one of on and in the actuator plate to a mounting support via at least one supply line spring;
- connecting at least one of a mirror element and a filter element via the actuator plate and the at least one supply line spring to the mounting support; and
- connecting the at least one of the mirror element and the filter element to the actuator plate via a spacer, wherein:
  - a first end of the spacer contacts an inner side of the at least one of the mirror element and the filter element facing away from an incident light surface of the at least one of the mirror element and the filter element, and
  - a second end of the spacer contacts a carrier side of the actuator plate aligned towards the at least one of the mirror element and the filter element.

14. The method as recited in claim 13, further comprising:
- additionally connecting the at least one of the mirror element and the filter element to the mounting support via at least one vibratory spring that spans at least one gap lying between the at least one of the mirror element and the filter element and the mounting support.

15. A method for producing a micromirror device, comprising:
- producing a micromechanical component according to a method comprising:
  - connecting an actuator plate including a coil situated at least one of on and in the actuator plate to a mounting support via at least one supply line spring;
  - connecting at least one of a mirror element and a filter element via the actuator plate and the at least one supply line spring to the mounting support; and
  - connecting the at least one of the mirror element and the filter element to the actuator plate via a spacer, wherein:
    - a first end of the spacer contacts an inner side of the at least one of the mirror element and the filter element facing away from an incident light surface of the at least one of the mirror element and the filter element, and
    - a second end of the spacer contacts a carrier side of the actuator plate aligned towards the at least one of the mirror element and the filter element;
- developing the at least one of the mirror element and the filter element as a mirror and adjustably about a first axis of rotation using a supplying of a current to the coil; and
- developing an additional mirror element that is adjustable about a second axis of rotation that is inclined to the first axis of rotation, the additional mirror element capable of deflecting a light beam onto the incident light surface of the at least one of the mirror element and the filter element during an operation of the micromirror device.

* * * * *